United States Patent
Hu et al.

(10) Patent No.: US 7,504,971 B2
(45) Date of Patent: *Mar. 17, 2009

(54) DECODING SYSTEMS AND METHODS

(75) Inventors: Yi Hu, Belfast (GB); Kyle McAdoo, Belfast (GB); Albert Simpson, Belfast (GB)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/760,303

(22) Filed: Jun. 8, 2007

(65) Prior Publication Data

US 2007/0230570 A1    Oct. 4, 2007

Related U.S. Application Data

(63) Continuation of application No. 11/287,630, filed on Nov. 28, 2005, now Pat. No. 7,245,242.

(51) Int. Cl.
*H03M 7/00* (2006.01)
(52) U.S. Cl. ...................................... 341/107; 709/247
(58) Field of Classification Search .......... 341/105–140
See application file for complete search history.

(56) References Cited

U.S. PATENT DOCUMENTS

| 5,774,206 | A  | * | 6/1998 | Wasserman et al. ......... 709/247 |
| 6,876,317 | B2 | * | 4/2005 | Sankaran ..................... 341/107 |
| 6,917,310 | B2 | * | 7/2005 | Pearson et al. .............. 341/107 |
| 6,927,710 | B2 | * | 8/2005 | Linzer et al. ................. 341/107 |
| 7,061,410 | B1 | * | 6/2006 | Pearson et al. .............. 341/107 |
| 7,245,242 | B2 | * | 7/2007 | Hu et al. ...................... 341/107 |
| 2004/0240559 | A1 | | 12/2004 | Prakasam et al. |
| 2004/0260739 | A1 | | 12/2004 | Schumann |
| 2004/0268329 | A1 | | 12/2004 | Prakasam |
| 2006/0176955 | A1 | | 8/2006 | Lu et al. |
| 2007/0120711 | A1 | | 5/2007 | Hu et al. |

* cited by examiner

*Primary Examiner*—Lam T Mai
(74) *Attorney, Agent, or Firm*—Peter Zawilski (57) ABSTRACT

Various embodiments of decoding systems and methods are disclosed. One system embodiment, among others, comprises a macroblock decode module configured to decode a plurality of context adaptive binary arithmetic coding (CABAC) encoded symbols corresponding to a slice without processor intervention.

20 Claims, 7 Drawing Sheets

FIG. 6 ion entitled, "Decoding Systems and Methods," having Ser. No. 11/287,630, filed Nov. 28, 2005, which is entirely incorporated herein by reference.

DECODING SYSTEMS AND METHODS

CROSS-REFERENCE TO RELATED APPLICATION

This application is a continuation of copending U.S. utility application entitled, "Decoding Systems and Methods," having Ser. No. 11/287,630, filed Nov. 28, 2005, which is entirely incorporated herein by reference.

BACKGROUND OF THE INVENTION

1. Field of the Invention

The present invention is generally related to image processing and, more particularly, is related to systems and methods for processing video data.

2. Related Art

The broadcast or on-demand communication of digital content has undergone considerable advancements recently, and has drawn in competitors from the cable, satellite, and telecom industries. In such a competitive environment, one focus has been the emergence of high definition television (HDTV) and its use in attracting new customers, the latter due at least in part to the improved perceptual picture quality associated with HDTV. An enabling technology in the transition to mainstream HDTV is found in the MPEG-4 AVC/H.264 (herein, simply H.264 or advanced video codec (AVC)) codec standard.

Although H.264 represents a major advance in algorithmic complexity compared to previous coding standards, H.264 brings with its inception a commensurate increase in decoder hardware and memory costs. For instance, H.264 compliant encoders use either context adaptive binary arithmetic coding (CABAC) or context adaptive variable length coding (CALVC) to encode the macroblock data (e.g., coefficients, motion vectors, etc.). CABAC encoding is more computationally intensive than CALVC encoding. One result of this increased complexity is that CABAC decoding operations often provide a source of throughput bottlenecks for a decoding system, since CABAC decoding is performed serially one symbol at a time.

SUMMARY

Embodiments of the present invention provide decoding systems and methods.

Briefly described, in architecture, one embodiment of the system, among others, comprises a macroblock decode module configured to decode a plurality of context adaptive binary arithmetic coding (CABAC) encoded symbols corresponding to a slice without processor intervention.

One method embodiment comprises, among others, receiving a slice comprising a plurality of context adaptive binary arithmetic coding (CABAC) encoded symbols, and decoding the slice without processor intervention.

Other systems, methods, features, and advantages of the present disclosure will be or become apparent to one with skill in the art upon examination of the following drawings and detailed description. It is intended that all such additional systems, methods, features, and advantages be included within this description and be within the scope of the decoding systems and methods.

BRIEF DESCRIPTION OF THE DRAWINGS

Many aspects of the decoding systems and methods can be better understood with reference to the following drawings.

The components in the drawings are not necessarily to scale, emphasis instead being placed upon clearly illustrating the principles of the decoding systems and methods. Moreover, in the drawings, like reference numerals designate corresponding parts throughout the several views.

DETAILED DESCRIPTION

Disclosed herein are various embodiments of decoding systems and methods. Such decoding systems comprise a context adaptive binary arithmetic coding (CABAC) decoder that performs symbol decoding in each (or substantially each) clock cycle. In one embodiment, the decoding system comprises a macroblock decode module (MDM) that manages registers comprising context information (e.g., mb_type, coded block pattern, and other macroblock level parameters corresponding to previously decoded macroblocks). The macroblock decode module also comprises hardware that is configured to decode all syntax elements (comprising one or more symbols) for a slice (e.g., one or more macroblocks) without processor or firmware (or software) intervention.

Although described in the context of ITU-T-Recommendation H.264, ISO/IEC 14496-10 Advanced Video Coding (AVC) Standard (MPEG-4 Part 10), the disclosure is not limited to the AVC standard, and thus other applications where CABAC coding is employed may similarly fall within the scope of the embodiments of the decoding systems and methods.

The decoding system embodiments disclosed herein can be implemented in hardware, software, and firmware (e.g., to control data flow) running on a microcontroller (e.g., 32-bit RISC microcontroller), or a combination thereof. In a preferred embodiment, the decoding system embodiments are implemented primarily in hardware implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 1A:
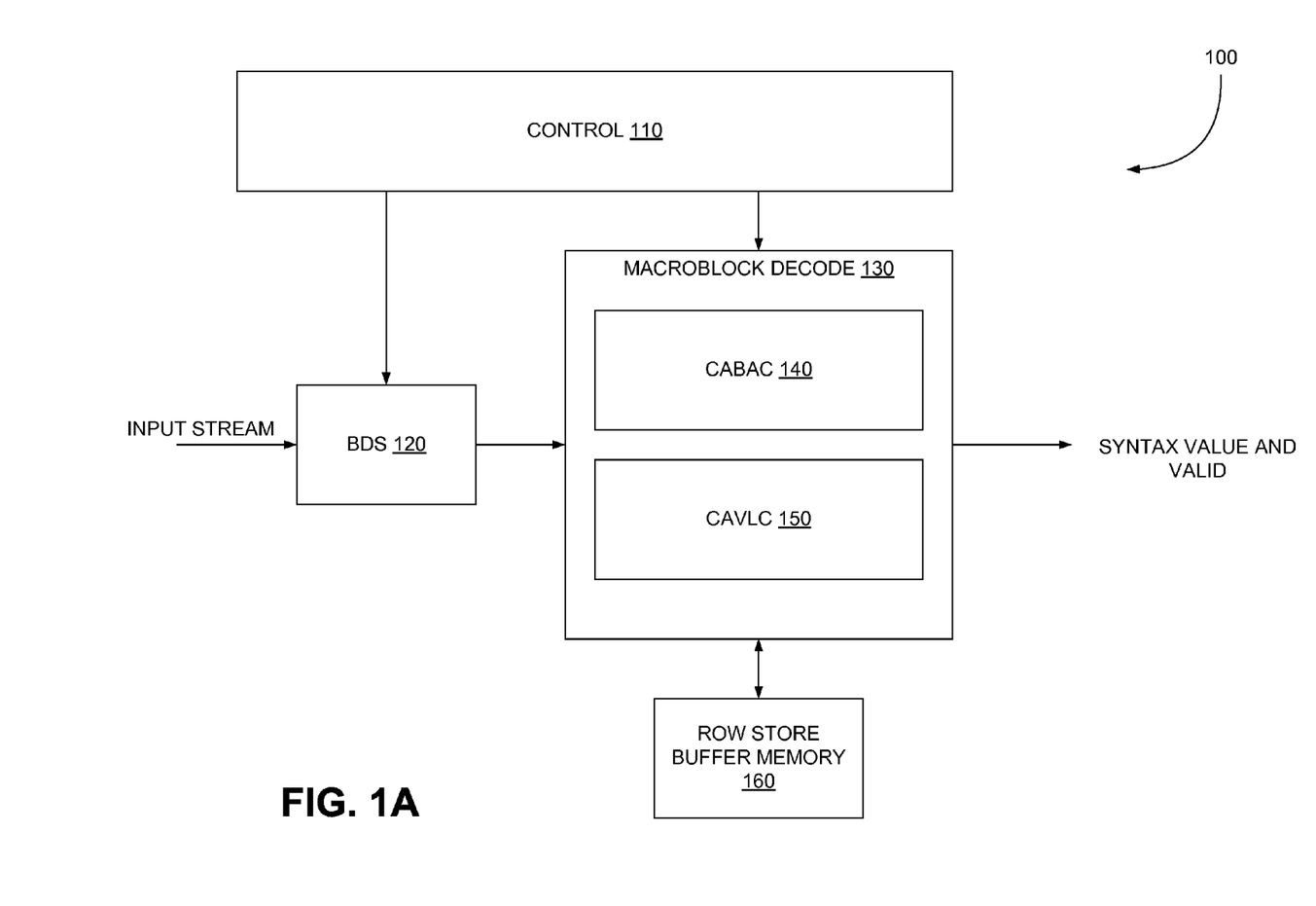
FIG. 1A is a block diagram of an embodiment of a decoding system.

FIG. 1A is a block diagram of an embodiment of a decoding system 100. The decoding system 100 may be embodied in any wired or wireless device, including computers (desktop, portable, laptop, etc.), consumer electronic devices (e.g., multi-media players), set-top boxes, television sets, video storage systems, telecommunication devices, personal digital assistants (PDAs), or any other type of devices with or without network capability, such as printers, fax machines, scanners, hubs, switches, routers, etc. The decoding system 100 comprises a control module 110, which may include a central processing unit (CPU) or microcontroller running firmware, a stream buffer and decode system (BDS) 120, a macroblock decode module (MDM) 130 comprising a context adaptive binary arithmetic coding (CABAC) decoder 140 and a context adaptive variable length coding (CAVLC) decoder 150, and a row store buffer memory 160 that interfaces with the MDM 130. Note that in some embodiments, the MDM 130 may communicate with the row store buffer memory 160 via an interface that comprises a module separate from the row store buffer memory 160.

The BDS 120 enables the real-time decoding of a selected stream configuration, and includes functionality (e.g., buffers, parsers, decoders, etc.) to decode headers and detect start codes (e.g., a network abstraction layer (NAL) start code). The BDS 120 also includes functionality to enable the extraction by the control module 110 of information such as picture size and structure, encoding type (e.g., CABAC, CAVLC), starting macroblock number for the slice, etc., among other functionality. Although shown as a single block, functionality of the BDS 120 can be distributed in a variety of configurations. Upon detection and decoding of a slice header, the control module 110 programs the slice parameters into the MDM 130 (e.g., in registers of the MDM 130) and instructs the MDM 130 to commence decoding of macroblock data.

The MDM 130 decodes the macroblock data that follows a slice header using the CABAC decoder 140 or CAVLC decoder 150 (e.g., the entropy mode, CABAC or CAVLC, is determined by the first slice header in a picture) to provide macroblock syntax elements. For example, the CABAC decoder 140 or CAVLC decoder 150 generate coefficients, macroblock parameters, macroblock motion information and I_PCM samples, among other information. Control of macroblock decoding resides within the MDM 130.

In one embodiment, the MDM 130 comprises macroblock context registers that include information from previously decoded macroblocks, such as mb_type, coded block pattern, reference picture indexes, and other macroblock level parameters that are used in decoding a slice. Such information (or history) is accessed from the row store buffer memory 160, and updates by the MDM 130 are also stored in the row store buffer memory 160. The row store buffer memory 160 comprises some or all of the data from previously decoded macroblocks to enable the macroblock decode module 130 to form a correct context for the current syntax element decoding operation. The MDM 130 provides syntax values and valid data for further downstream processing.

One skilled in the art would understand that additional and/or different components and/or functionality not shown may be employed as part of, or in cooperation with, the decoding system 100, such as internal memory, inverse transform and inverse quantization, inter prediction, and/or de-blocking functionality, among other functionality.

Figure 1B:
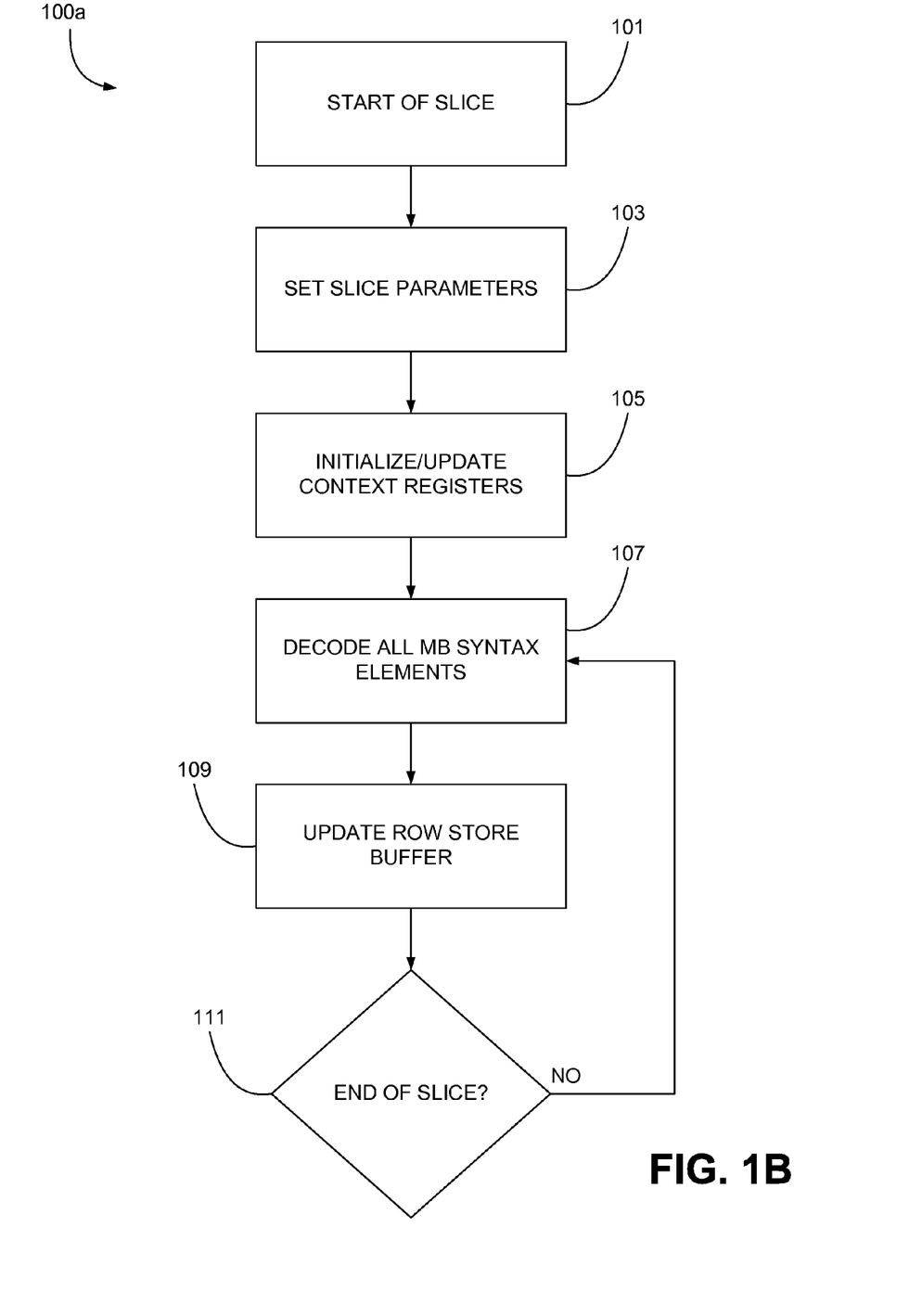
FIG. 1B is a flow diagram that illustrates one method embodiment of the decoding system of FIG. 1A.

One method of operation for the decoding system 100, designated as method embodiment 100a, is illustrated in FIG. 1B. In response to detection of a slice header, the BDS 120 informs the control module 110 of the detected slice header (101). The control module 110 responsively decodes the slice header and programs the MDM 130 with the slice parameters and instructs the MDM 130 to commence decoding (103). The MDM 130 initializes and/or updates macroblock context registers with context information from the row store buffer memory 160 (105), and using such context information, decodes all macroblock syntax elements (107). The MDM 130 updates the row store buffer memory 160 (109), and responsive to determining that the end of a slice has not been reached (111), continues processing at block 107. Following the decoding of the final slice of a picture, the decoded picture is inserted into a decoded picture buffer (not shown) and, if appropriate, the picture is bumped into an output queue.

Note that the control module 110 is not involved in the decoding process from blocks 105 through 111. All the control logic (e.g., hardware) required to entropy decode a slice is contained within the MDM 130, and the hardware of the MDM 130 can run off of a single non-gated clock (although in some embodiments, gating may be implemented without affecting the functionality of the decoding system 100) and thus operate without processor/firmware/software intervention.

Figure 2:
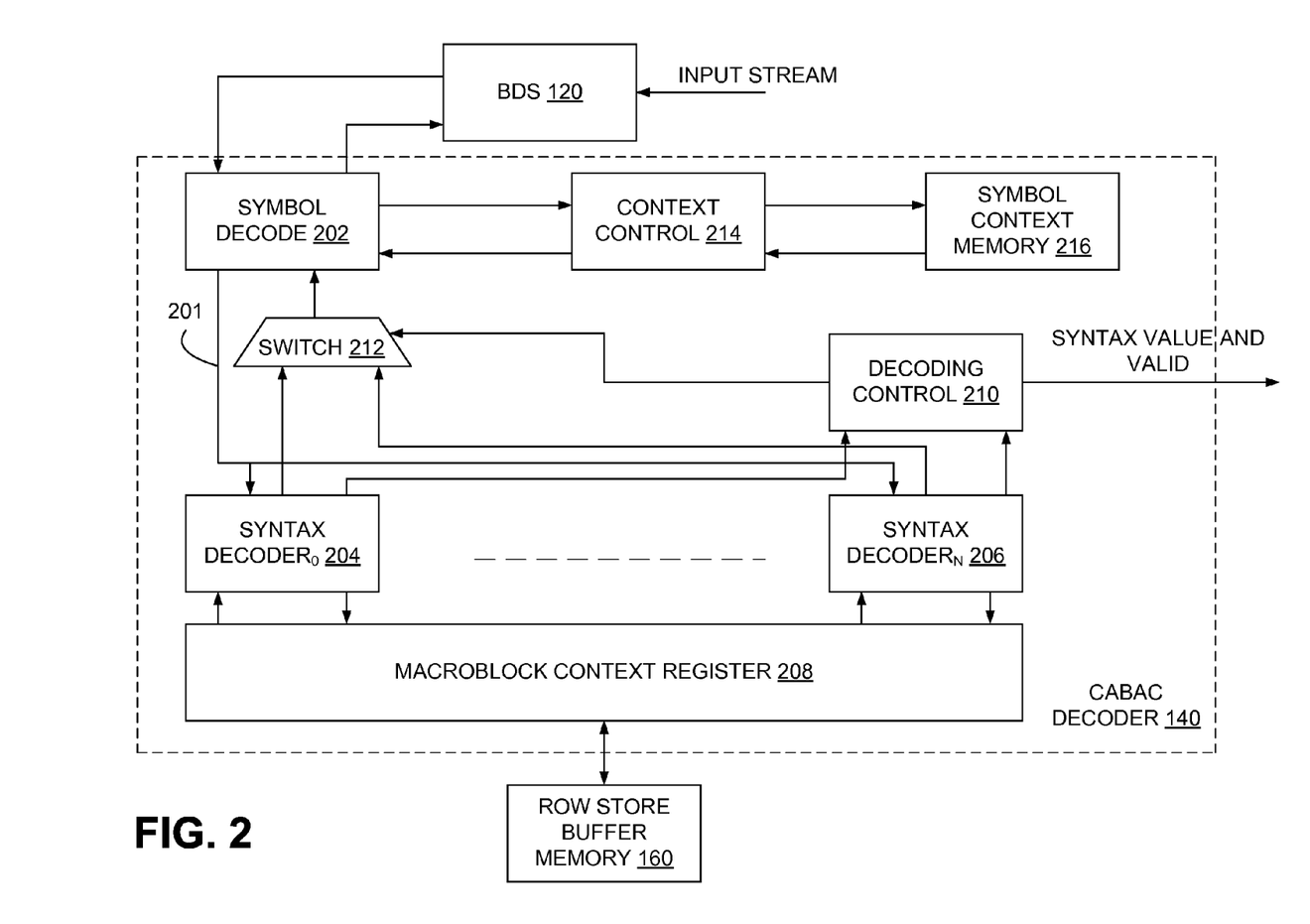
FIG. 2 is a block diagram of an embodiment of a context adaptive binary arithmetic coding (CABAC) decoder of the decoding system shown in FIG. 1A.

FIG. 2 is a block diagram of an embodiment of the CABAC decoder 140. Decoding a CABAC coded macroblock in H.264 environments involves decoding a series of syntax elements as specified by the syntax of the H.264 standard. These syntax elements are decoded as a series of one or more binary symbols, where each symbol is decoded as either a "1" or "0" and the combination of these symbols comprise a syntax element. The CABAC decoder 140 comprises a symbol decode module 202, one or more syntax decoders, such as syntax decoder$_0$ 204 through syntax decoder$_N$ 206, a macroblock context register 208, a decoding control module 210, a switch module 212, a context control module 214, and a symbol context memory 216.

The symbol decode module 202 receives a series of entropy coded syntax elements from the BDS 120 and decodes symbols in response to commands from the active syntax decoder 204, 206 (which in turn is controlled by the decoding control module 210). That is, the symbol decode module 202, acting as a slave to the syntax decoder 204, 206, decodes a series of symbols, and the syntax decoder 204, 206 interprets the series of symbols to create syntax values. The decoding control module 210 ensures that the correct series of syntax values are decoded in the correct order. The command(s) from the active syntax decoder 204, 206 are received via switch module 212 (e.g., multiplexer). Each syntax decoder 204, 206 knows when it has reached the end of its responsible syntax element by comparing the pattern of decoded bits against all possible patterns to see if there is a match. The active syntax decoder 204, 206 makes current decoded data available to the decoding control module 210 so that the module 210 can decide what type of syntax element to decode next. The syntax decoder 204, 206 retrieves data about neighboring macroblocks from the macroblock context register 208 to allow the context ID to be determined.

In one embodiment, the decoding control module 210 comprises a state machine that is configured to follow the high level syntax of a macroblock, enabling the module 210 to determine what syntax element to decode next based on the previous decoded syntax element for the macroblock. For example if the decoding control module 210 decodes a macroblock type as "skipped," it knows not to decode coefficients. The decoding control module 210 provides an enabling control signal to the switch module 212 to select which syntax decoder 204 or 206 is to drive the symbol decode module 202. At the end of each macroblock, the relevant data in the macroblock context register 208 is stored in the row store buffer memory 160 and data for the next macroblock is retrieved.

Decoding a symbol involves selecting a context model for the decision based on the type of symbol to be decoded and the history of similar decisions for spatial neighbors. When decoding a symbol, the model that is used to decode such a symbol is selected based upon the context of the decision. Each context has a number of possible states, equating to probabilities, through which the CABAC decoder 140 transitions based on the decoding of symbols that use that context.

The states and transition conditions for transitioning are specified in the H.264 standard.

Figure 3:
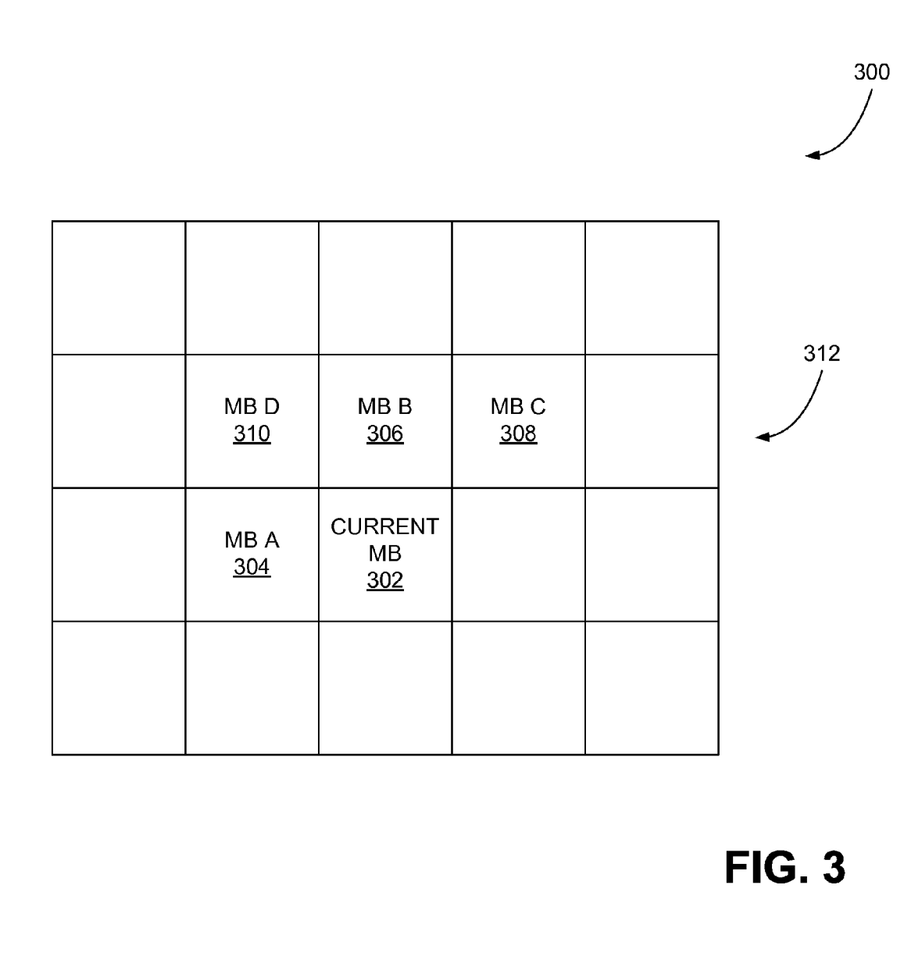
FIG. 3 is a schematic diagram that illustrates exemplary macroblock context information.

The context generally refers to the history of similar decisions for spatial neighbors of the current location. FIG. 3 is a schematic diagram 300 that illustrates exemplary macroblock context information. Depending on the decision, these neighbors may be from the current macroblock 302 or from the adjacent macroblocks comprising macroblock A (MB A) 304, MB B 306, MB C 308, and MB D 310. Macroblock A 304 is the left neighbor of the current macroblock 302, and so the context information for it can be stored locally. Information for the other neighbors comes from the previously decoded row 312 of macroblocks (where a row consists of all the macroblocks across a picture), and information for these macroblocks of row 312 is stored in the row store buffer memory 160.

At the start of decoding a macroblock, information corresponding to the neighbors is read from the row store buffer memory 160 and stored in the macroblock context register 208, which provides a local information store. The syntax decoder 204, 206 reads the information from the macroblock context register 208 to determine the context. The decoding control module 210 decides what syntax element to decode, and thus effectively gives a range of context IDs for symbol decoding. The syntax decoder 204, 206 uses the neighboring macroblock information from macroblock context register 208 to select the actual context ID inside the given range of context IDs.

As indicated above, the history is used to determine a context ID, which in turn allows the state of the corresponding model to be read from the symbol context memory 216 via context control module 214. The context control module 214 retrieves the context model state information from the memory 216 and updates the same following a symbol decode by the symbol decode module 202. The context model state information for each symbol is updated based on the decoding of the previous symbols in that state, which may have come from the current macroblock, the current syntax element, etc. The context model state information comprises the probability of decoding the most probable symbol (MPS) and whether the MPS is a "1" or "0".

Upon completion of the syntax decoding for a particular macroblock, the context information is also updated. For instance, at the end of a macroblock, the row store buffer memory 160 is updated with contents of the macroblock context register 208, with MB A 304 replaced by MB 302 in the register. In general, the macroblock context register 208 is constantly updated after each syntax element is decoded, and the row store buffer memory 160 is updated at the end of the macroblock.

In light of the description above, it will be appreciated that one method of operation for the CABAC decoder 140, designated as method embodiment 140a and illustrated in FIG. 4, can be described as follows. At the start of a macroblock (401), the decoding control module 210 determines the syntax element type (403). The syntax decoder 204, 206 determines the context ID based on historical data retrieved from the macroblock context register 208 and the range provided by the decoding control module 210 (405). The context control module 214 retrieves the context model state information from the memory 216 (407). The symbol decode module 202 decodes a symbol based on the context model state information, and the context control module 214 updates the context model state information following a symbol decode by the symbol decode module 202 (409). The syntax decoder 204, 206 determines whether the end of a syntax element has been reached (411). If the end of a syntax element has not been reached, processing returns to block 405, otherwise a determination is made by the decoding control module 210 whether the end of a macroblock has been reached (413). If the end of a macroblock has not been reached, processing continues to block 403, otherwise processing is complete for the given macroblock.

Figure 5:
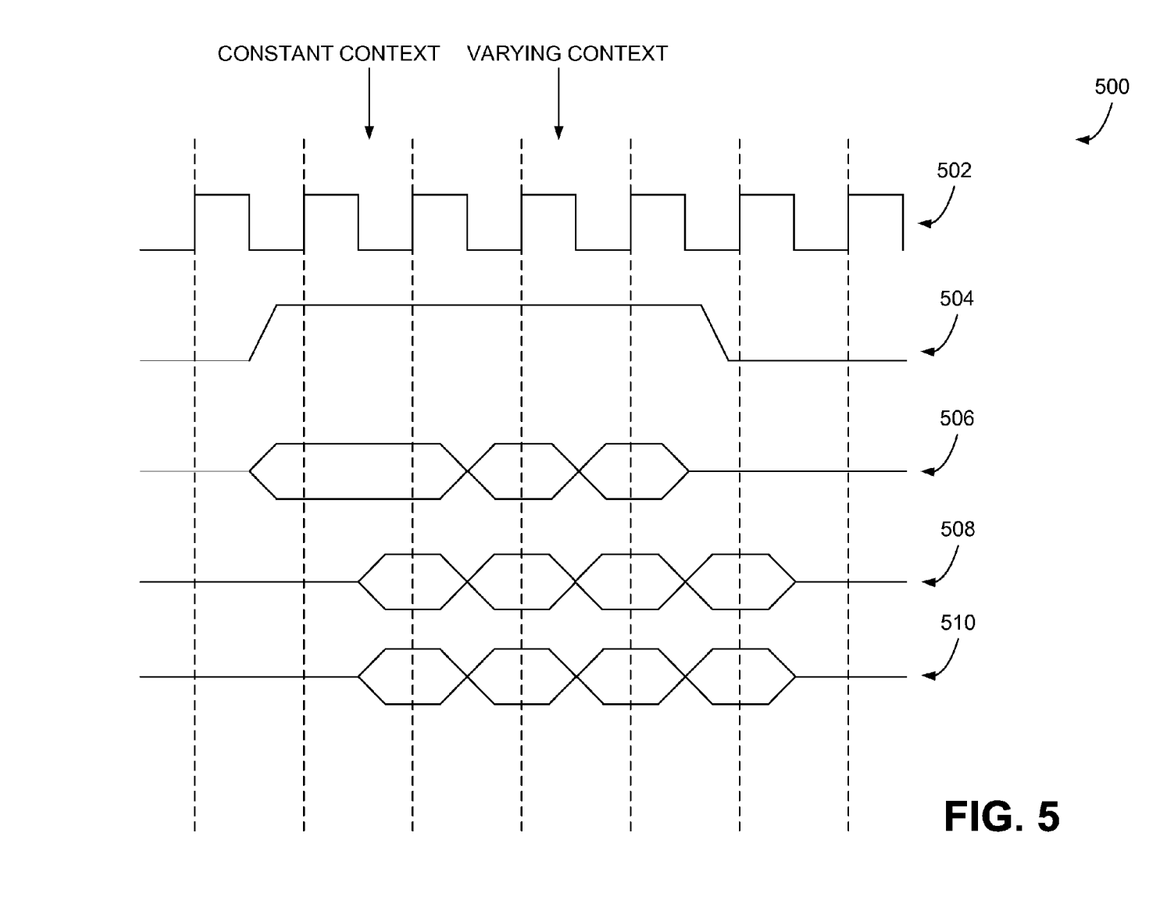
FIG. 5 is a timing diagram that illustrates decoding by the CABAC decoder shown in FIG. 2.

FIG. 5 is a timing diagram 500 that illustrates decoding by the CABAC decoder 140. Line 502 corresponds to a clock pulse signal derived externally from the decoding system 100. Line 504 corresponds to a command signal. The waveform corresponding to line 504 is generated by the active syntax decoder 204, 206, which tells the symbol decode module 202 to decode a symbol, or not (and thus do nothing), as the case may be. Line 506 corresponds to a context ID, revealing a constant context and a varying context. Line 508 corresponds to state/MPS, which is used by the symbol decode module 202 to decode a symbol. Line 510 corresponds to sym_value data on connection 201 (FIG. 2). A symbol is decoded on a single cycle, regardless of whether the context ID (line 506) changes or not.

Note that symbols are decoded continuously at a rate of one symbol per clock cycle, but in some situations where the context for the next symbol decode depends on the result of the current symbol decode, it may be advantageous to insert a cycle delay between symbol decodes to allow a higher clock frequency to be achieved.

Figure 6:
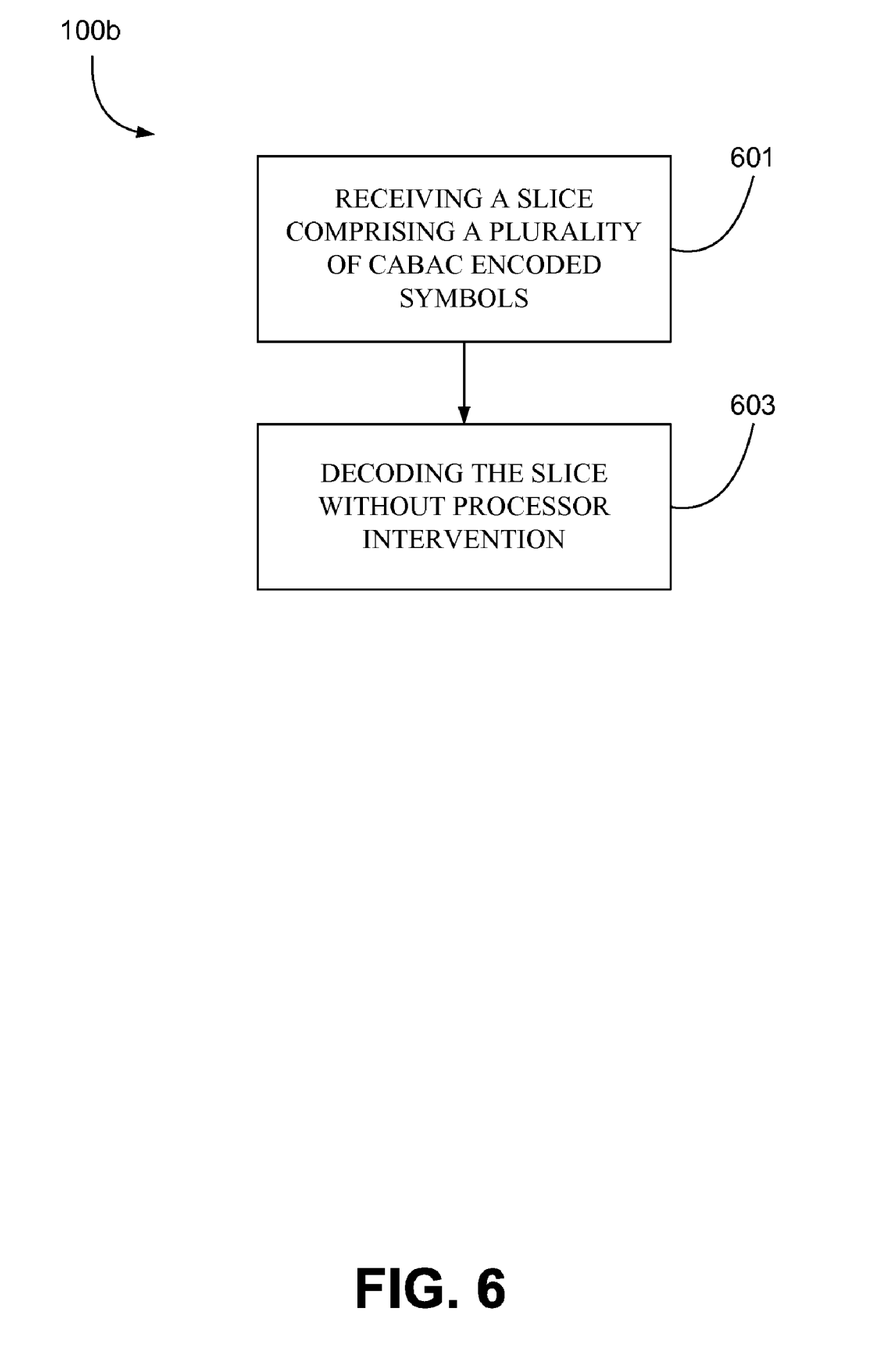
FIG. 6 is a flow diagram that illustrates one decoding method embodiment of the decoding system shown in FIG. 1A.

In light of the description above, it will be appreciated that one decoding method embodiment 100b, illustrated in FIG. 6, can be described as receiving a slice comprising a plurality of CABAC encoded symbols (601), and decoding the slice without processor intervention (603).

Figure 4:
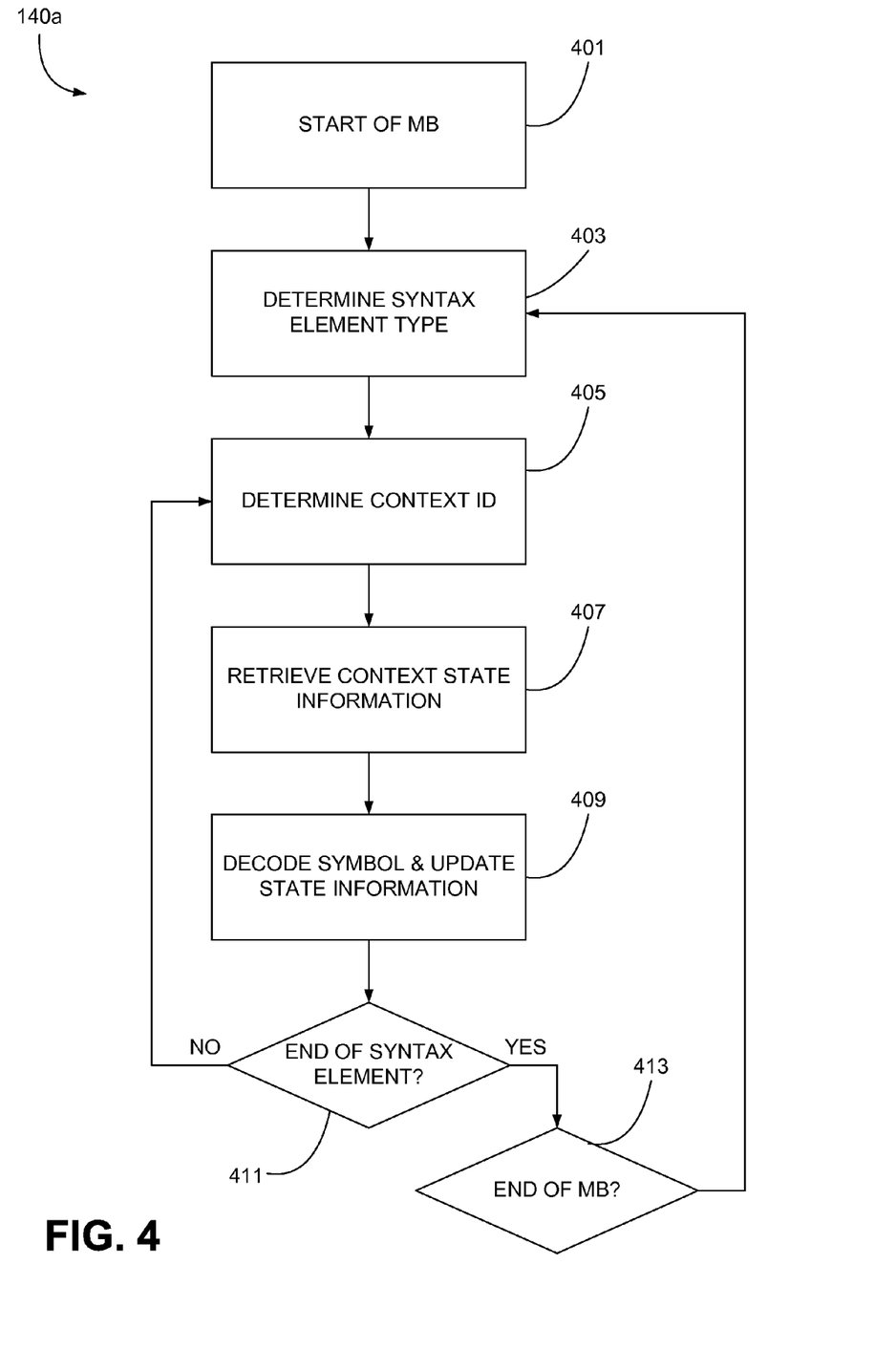
FIG. 4 is a flow diagram that illustrates one method embodiment of the CABAC decoder shown in FIG. 2.

Any process descriptions or blocks in flow diagrams shown in FIGS. 1B, 4, or 6 should be understood as representing modules or logic, segments, or portions of code which may include one or more executable instructions for implementing specific logical functions in the process, and alternate implementations are included within the scope of the preferred embodiments in which functions may be executed out of order from that shown or discussed, including substantially concurrently or in reverse order, depending on the functionality involved, as would be understood by those reasonably skilled in the art.

It should be emphasized that the above-described embodiments, particularly, any "preferred" embodiments, are merely possible examples of implementations, merely set forth for a clear understanding of the principles of the invention. Many variations and modifications may be made to the above-described embodiments without departing substantially from the spirit and principles of the invention. All such modifications and variations are intended to be included herein within the scope of this disclosure.

What is claimed:

1. A decoding method, comprising:
    receiving a slice comprising a plurality of context adaptive binary arithmetic coding (CABAC) encoded symbols;
    retrieving context information corresponding to previously decoded macroblocks;
    decoding the slice without processor or software intervention; and
    updating the context information based on decoding all macroblock syntax elements of the slice.

2. The method of claim 1, further comprising retrieving context state information based on the context information.

3. The method of claim 2, further comprising updating the context state information responsive to each symbol decoding.

4. The method of claim 1, wherein decoding comprises symbol decoding in each clock cycle.

5. A decoding system, comprising:
   a macroblock decode module configured to retrieve context information corresponding to previously decoded macroblocks, to decode a plurality of context adaptive binary arithmetic coding (CABAC) encoded symbols corresponding to a slice without processor or software intervention, and to update the context information based on decoding all macroblock syntax elements of the slice.

6. The system of claim 5, wherein the macroblock decode module comprises a symbol decode module configured to perform symbol decoding in each clock cycle.

7. The system of claim 6, wherein the macroblock decode module comprises a plurality of syntax decoders configured to retrieve context information from a register and determine a context ID based on the context information.

8. The system of claim 7, wherein the macroblock decode module comprises a decoding control module configured to determine which of the plurality of syntax decoders is to drive the symbol decode module based on previously decoded syntax elements.

9. The system of claim 8, wherein the macroblock decode module comprises a switch module which, responsive to communication by the decoding control module, selects one of the plurality of the syntax decoders to drive the symbol decode module.

10. The system of claim 9, wherein the selected syntax decoder provides the context ID to the symbol decode module.

11. The system of claim 7, wherein the macroblock decode module comprises a context control module and symbol context memory, wherein the context control module is configured to retrieve context state information based on the context ID from the symbol context memory and provide the context state information to the symbol decode module.

12. The system of claim 11, wherein the macroblock decode module is configured to decode one of the plurality of symbols based on the context state information.

13. The system of claim 11, wherein the symbol decode module is configured to decode the symbols.

14. The system of claim 5, further comprising a control module and stream buffer and decode system configured to decode slice headers and detect start codes.

15. The system of claim 5, further comprising a control module configured to program slice parameters into the macroblock decode module and instruct the macroblock decode module to commence decoding of macroblock data.

16. The system of claim 5, further comprising a row store buffer coupled to the macroblock decode module and configured to store context information corresponding to previously decoded macroblocks.

17. The system of claim 5, wherein the macroblock decode module comprises a context adaptive binary arithmetic coding (CABAC) decoder.

18. The system of claim 5, wherein the macroblock decode module is embodied in a wired device or a wireless device.

19. The system of claim 5, wherein the macroblock decode module is embodied in a computer, consumer electronic device, set-top box, television set, video storage system, telecommunication device, or personal digital assistant (PDA).

20. A decoding system, comprising:
   means for receiving a slice comprising a plurality of context adaptive binary arithmetic coding (CABAC) encoded symbols;
   means for retrieving context information corresponding to previously decoded macroblocks;
   means for decoding the slice without processor or software intervention; and
   means for updating the context information based on decoding all macroblock syntax elements of the slice.

* * * * *